United States Patent [19]
Blair et al.

[11] Patent Number: 5,315,273
[45] Date of Patent: May 24, 1994

[54] ATTENUATOR RELAY

[75] Inventors: Eddie L. Blair, Huntington Beach; John B. Brownwood, West Covina; Delo K. K. Chun, Laguna Niguel, all of Calif.

[73] Assignee: Teledyne Industries Inc., Los Angeles, Calif.

[21] Appl. No.: 969,435

[22] Filed: Oct. 30, 1992

[51] Int. Cl.⁵ .............................................. H03H 7/24
[52] U.S. Cl. .................................... 333/81 R; 323/354
[58] Field of Search ........................... 333/81 R, 81 A; 323/353, 354; 307/98, 113, 125; 361/170

[56] References Cited

U.S. PATENT DOCUMENTS 3,019,402  1/1962  Lanctot ............................ 333/81 A
3,319,194  5/1967  Adam ................................ 333/81 R
3,626,352  12/1971  McCoig ......................... 333/81 R X Primary Examiner—Paul Gensler
Attorney, Agent, or Firm—Blakely Sokoloff Taylor & Zafman

[57] ABSTRACT

An attenuator relay including encapsulation apparatus having an interior for enclosing an electro-mechanical relay and circuitry; an electro-mechanical relay having a number of contacts, the relay providing apparatus for closing a first circuit to allow current flow therethrough in a first condition, and apparatus for closing a second circuit to allow current flow therethrough in a second condition; and an attenuator circuit connected in the first circuit and enclosed within the encapsulating apparatus.

13 Claims, 6 Drawing Sheets

| Attenuation | Resistance (ohms) | | | Style |
| --- | --- | --- | --- | --- |
| dB | R1 | R2 | R3 | |
| 1 | 5.77 | 434 | -- | L |
| 2 | 5.73 | 5.73 | 215.20 | T |
| 4 | 226.30 | 226.30 | 24.42 | π |
| 8 | 21.58 | 21.58 | 47.40 | T |
| 10 | 25.93 | 25.93 | 35.05 | T |
| 16 | 68.83 | 68.83 | 153.90 | π |
| 20 | 61.05 | 61.05 | 248.30 | π |
Figure 6A
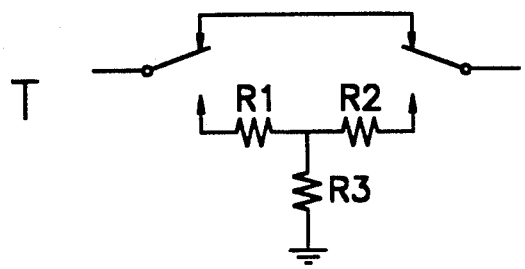
Figure 6B
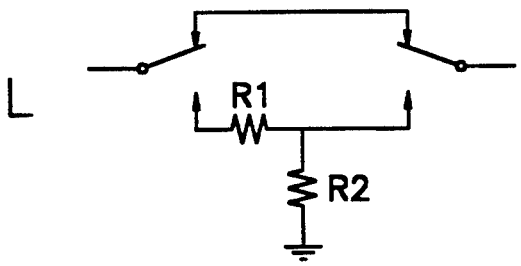
Figure 6C
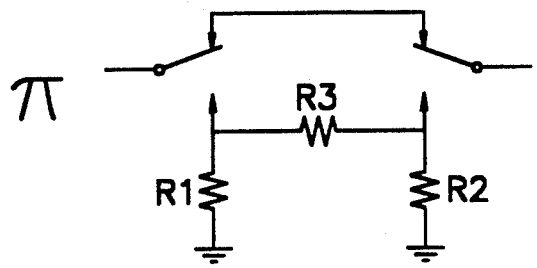
Figure 6D

ATTENUATOR RELAY

BACKGROUND OF THE INVENTION

1. Field of the Invention

This invention relates to electro-mechanical relays and, more particularly, to electro-mechanical relay apparatus including a built-in attenuator network.

2. History of the Prior Art

Electro-mechanical relays have been used in electronic circuits for as long as such circuits have been manufactured. Such relays utilize a mechanical connector which is opened and closed to make contact between two points in a electric circuit. Although many such relays have been replaced by electronic switches which may be made very small and thus may be placed within the tiny circuits of modern electronics, many situations exist where the electrical-performance of an electro-mechanical relay is superior to that of the electronic switch. For example, an electro-mechanical relay can achieve a flat amplitude response well into the gigahertz frequency range and still have a response down to direct current. The power handling capabilities of an electro-mechanical switch greatly exceed those of electronic switches. For these and many other reasons, electro-mechanical switches are useful in many situations.

Moreover as the circuitry associated with electro-mechanical relays has become smaller and smaller, so have the electro-mechanical relays. Today, such relays often fit into packages of less than 0.05 cubic inches.

One type of mechanical switch provides two current paths through electronic circuitry so that two independent operations may be selected One specific use of such a switch is to provide a signal to a piece of electronic equipment in one position of the switch or, alternatively, to attenuate a signal for some other within the equipment in the other position of the switch. For example, a receiver for electronic signals may use a mechanical switch to activate either the receiver or built-in self-test equipment which assures that the receiver is operating correctly. However, the typical signal generated for self-testing a radio receiver is much too large to use, on the order of five milliwatts, and simply saturates the equipment (which is designed to detect small signals) producing no useful information. In order to utilize this locally generated signal with the self-testing circuitry, it is necessary to drastically attenuate the signal. Consequently, attenuator circuits have been designed to reduce the value of the testing signal to a value such as five micro-microwatts which would be typical of a received signal. Other values of attenuation may also be used in particular circuits. Such an attenuated signal may then be routed by the electro-mechanical relays and used for self testing. Many other uses exist for an electro-mechanical relay and circuitry capable of providing both a straight connection and an attenuated path.

Such attenuators operate efficiently but have a number of draw backs. First, the typical attenuator circuitry is much too large, ten times or greater than the volume of the relays with which they are associated, to conveniently fit within the same package as the receiver circuitry; so it is inconvenient to build them into the receiver without substantially enlarging the package. Second, because of their size, such attenuator circuits cannot be used with higher frequency receivers. The length of the connectors used offers too much residual impedance for use in high frequency circuitry. For example, receivers operating at about 1.5 gigahertz are about the upper limit for use with such attenuators.

SUMMARY OF THE INVENTION

It is, therefore, an object of the present invention to provide a combined attenuator relay.

It is another more specific object of the present invention to provide an improved attenuator relay which may be used with higher frequency devices.

It is another object of the present invention to provide an attenuator relay which may be used with many different internal attenuator networks.

These and other objects of the present invention are realized in an attenuator circuit encapsulated in the enclosure of a standard sized electro-mechanical relay. The attenuator circuit is made up of components which may be deposited on the surface of a substrate which will fit within a typical relay enclosure. The attenuating circuit may be varied on the substrate to produce a plurality of different attenuator networks.

These and other objects and features of the invention will be better understood by reference to the detailed description which follows taken together with the drawings in which like elements are referred to by like designations throughout the several views.

BRIEF DESCRIPTION OF THE DRAWINGS

FIGS. 6(a-d) are schematic diagrams of the attenuator circuitry of the invention and a table listing values of elements of those diagrams.

DETAILED DESCRIPTION OF THE INVENTION

Figure 1:
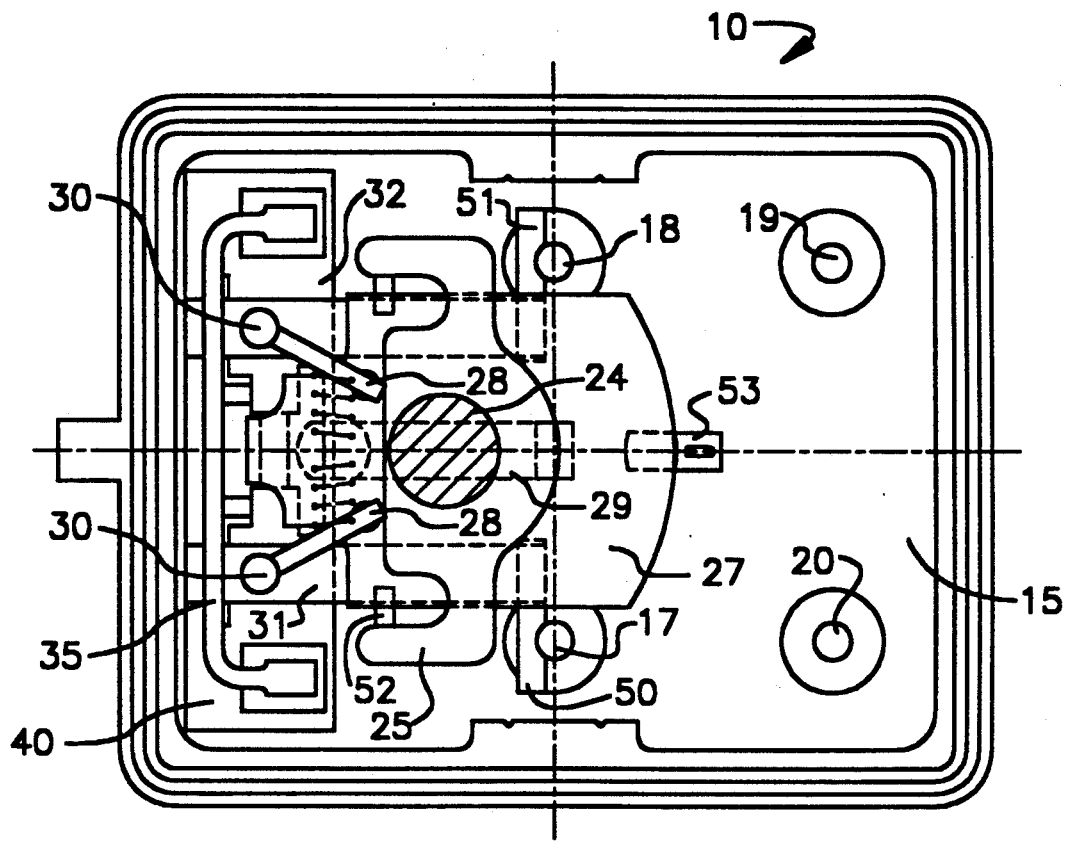
FIG. 1 is a top view of an attenuator relay in accordance with the invention.
Figure 2:
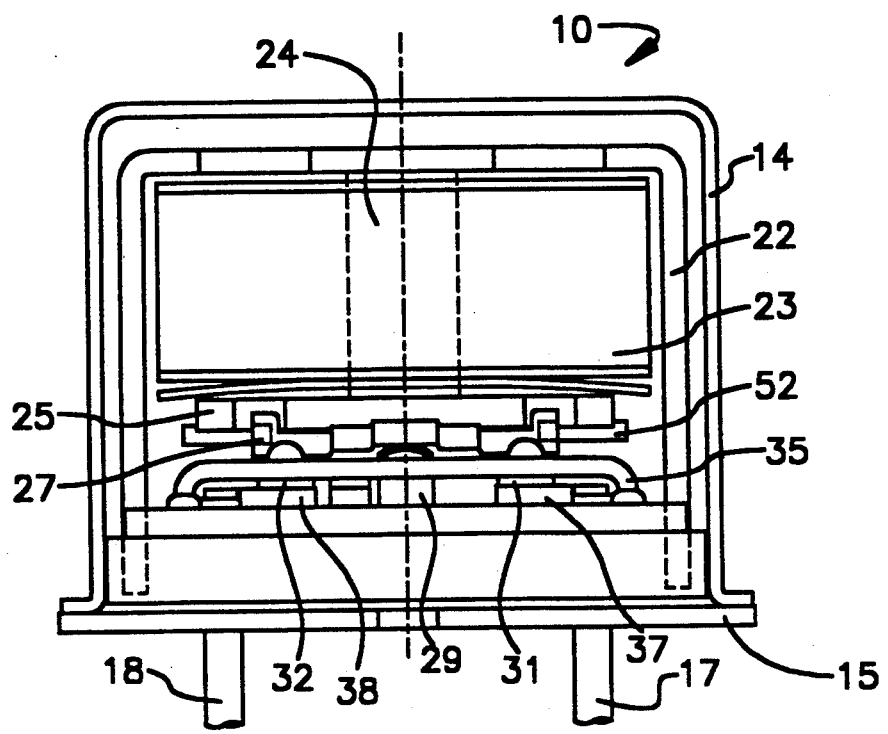
FIG. 2 is a front view of an attenuator relay in accordance with the invention.
Figure 3:
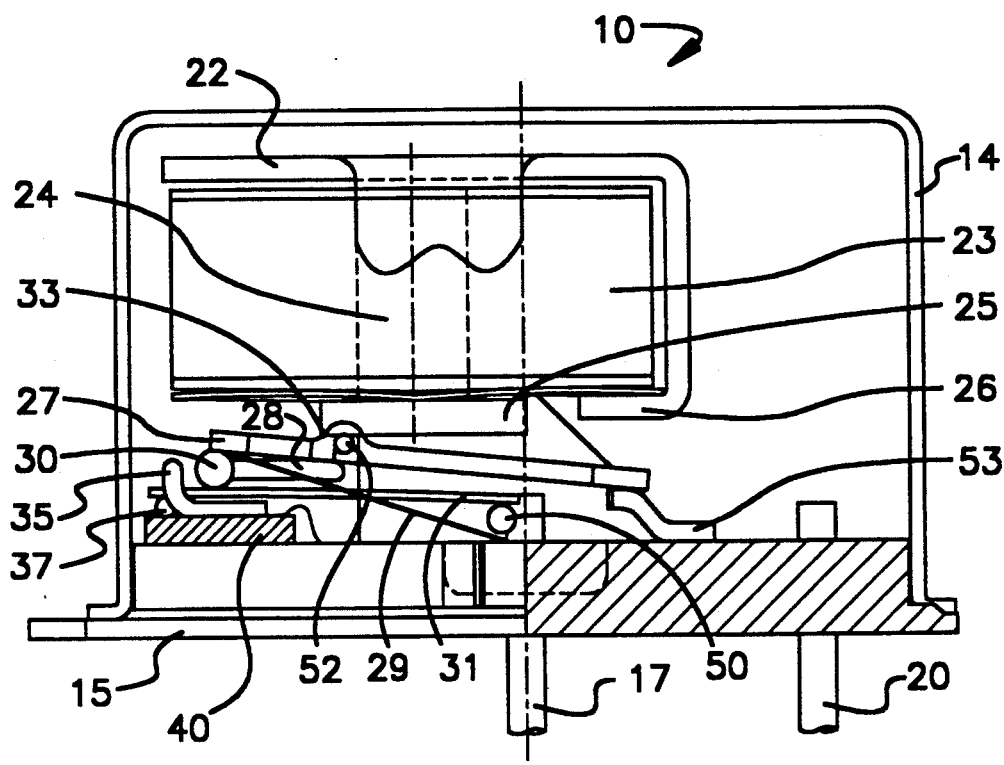
FIG. 3 is a side view of an attenuator relay in accordance with the invention.
Figure 5:
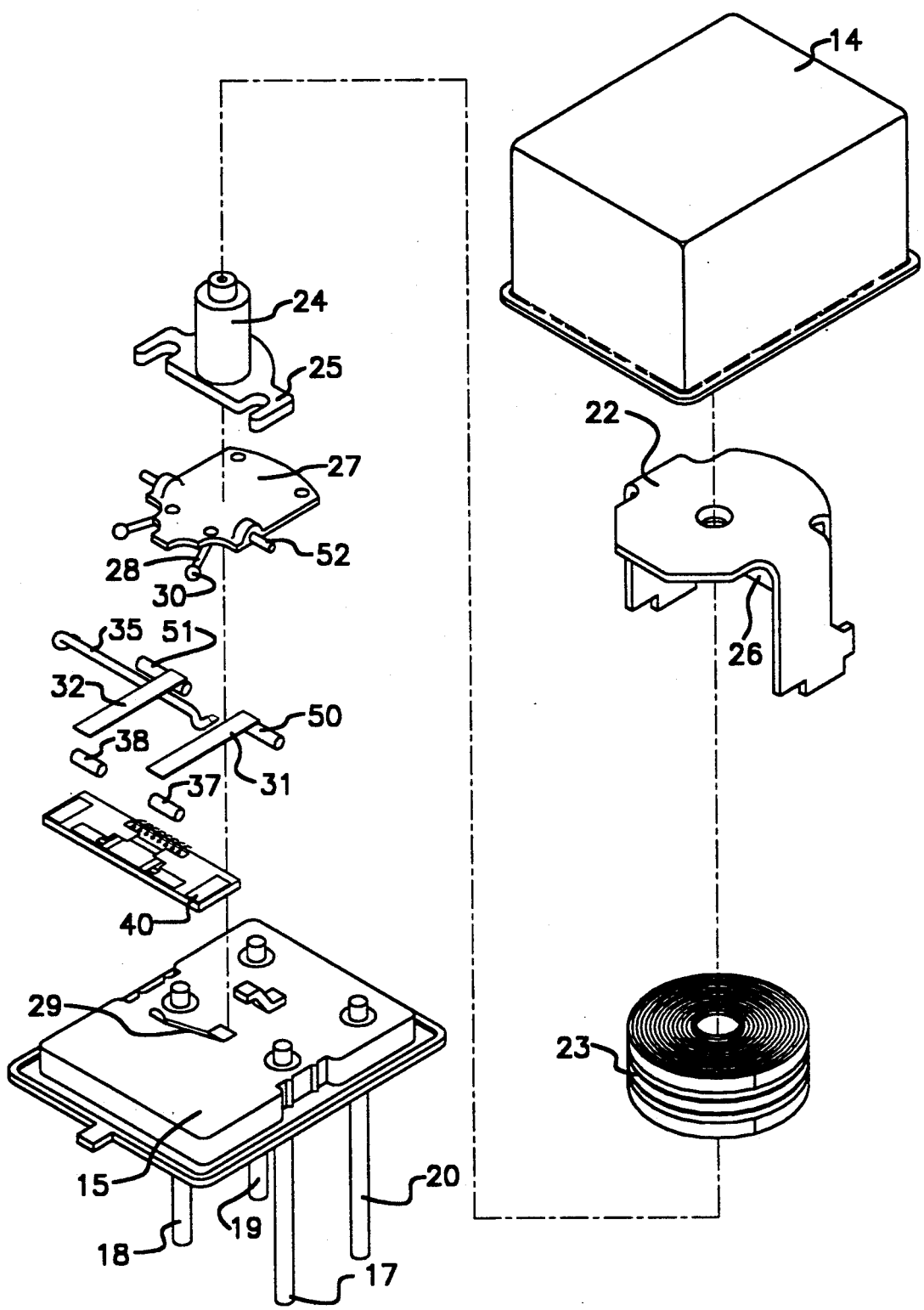
FIG. 5 is an exploded perspective view of the attenuator relay illustrated in FIG. 1-4.

Referring now to FIGS. 1, 2, and 3, there are illustrated top, front, and side views of an attenuator relay 10 constructed in accordance with the present invention. FIG. 5 is an exploded perspective view of the same attenuator relay 10 which is useful in understanding the arrangement of its parts. The relay 10 is enclosed within a encapsulating cover 14 which may be constructed of metal and in one embodiment measures 0.475 inches in length, 0.375 inches in width, and 0.275 inches in height.

The relay 10 is mounted upon a metal base plate 15 through which project four conductors 17-20 leading from exterior circuitry (not shown) to the interior of space enclosed by the plate 15 and the cover 14. The four conductors 17-20 are each insulated from the base plate 15. Positioned on the base plate 15 is a frame or bracket 22 mounting a coil 23 used to provide the electromotive force for switching the relay 10. The two ends of the coil 23 are electrically connected to the two conductors 19 and 20 so that current for switching the relay may be applied. A core 24 runs through the coil 23, and a first pole piece 25 is attached to a lower end of the core 24. A second pole piece is formed from the bracket 22 in which the upper end of the core 24 is positioned. The second pole piece continues downwardly around the outside of the coil 23 within the cover 14 and ultimately lies with one end 26 adjacent the first pole piece 25. The application of current to the coil 23 causes an electromotive field to be set up for operating the relay 10 within the interior formed by the plate 15 and the cover 14.

An armature 27 is fixed to pole piece 25 by pivot pins 52 so that it rotates about the lower surface fulcrum edge of the pole piece 25. In the normally unenergized condition of the coil 23, the armature 27 is in position with its left end (as seen in FIG. 3) raised and its right end bearing against a stop 53. This position is maintained by a return spring 29 which bears against the lower surface of the armature 27. When current flows through the coil 23, an electromagnetic force flows through the core 24. This causes the right end of the armature 27 to be attracted to the pole piece 26. The armature 27 is fixed to and pivots about an axis at the lower surface of the pole piece 25 causing a pair of insulating balls 30 to be moved downwardly when the left end of armature 27 is rotated downwardly. The balls 30 are fixedly attached to the armature 27 by extensions 28 and bear on the upper surfaces of contact arms 31 and 32. Thus, the downward rotation of the armature 27 is translated into the downward movement of the contact arms 31 and 32.

A conductive contact piece 35 is held above the base plate 15 and is mounted to a non-conductive substrate 40 positioned on the upper surface of the plate 15. The substrate 40 may be constructed of an insulating material such as alumina. Thus, the contact piece 35 is insulated from the plate 15. In the normally-closed (unenergized) position of the relay 10, the contact arms 31 and 32 bear upward against the contact piece 35 and are conductively connected by the contact piece 35. The contact arms 31 and 32 are connected to the conductors 17 and 18, respectively, via cross bars 50 and 51 and thus provide direct electrical contact between the conductors 17 and 18 when the contact arms 31 and 32 bear against the contact piece 35. In this condition of the relay 10, the electrical circuitry associated therewith, such as a receiver, may be directly connected for operation.

When the contact arms 31 and 32 are lowered by the flow of current through the coil 23 which rotates the armature 27, they come to bear upon a pair of conductive contacts 37 and 38. The contacts 37 and 38 are mounted to the upper surface of the substrate 40. The substrate 40 is, in turn, mounted on the upper surface of the plate 15. In the embodiment illustrated in FIG. 4, the substrate 40 carries three pads 42, 43, and 44 of resistive material A first conductor 46 laid on the surface of the substrate 40 connects the contact 37 to one end of the resistive pad 42. A second conductor 47 laid on the surface of the substrate 40 connects the contact 38 to one end of the resistive pad 43. A third conductor 49 on the surface of the substrate 40 connects a second end of the resistive pad 42 and a second end of the resistive pad 43 with the resistive pad 44. A fourth conductor 45 on the surface of the substrate 40 connects the other end of resistive pad 44. This fourth conductor 45 is grounded to the base plate 15 by wire bonds 48. Thus the resistive pads 42–44 formed on the upper surface of the substrate 40 provide resistors (hereafter referred to as resistors 42–44) connected together by conductive surfaces 46, 47, and 49 also formed on the upper surface of the substrate 40. These resistive pads 42–44 may be made of material well known to those skilled in the art such as tantalum nitride deposited on the substrate 40 by a process such as thin film deposition. The conductors 46, 47, and 49 may be formed of gold and are much shorter than conductors used in prior art attenuator networks.

When the contact arms 31 and 32 are touching the contacts 37 and 38, a "T" network of resistors 42–44 is connected in circuit between the terminals 17 and 18 in the embodiment shown. This T network is illustrated schematically in FIG. 6b. This T network acts as an attenuator, such as an attenuator for a receiver, when the path through the T network of the relay is chosen. In one embodiment of this T network, the resistors 42 and 43 are each 0.0086×0.035 inches and offer approximately 26 ohms of resistance while the resistor 44 is 0.013×0.040 inches and offers approximately 35 ohms of resistance. The length of the conductors 46, 47, and 49 is similarly short as is illustrated in the FIG. 4 (which is essentially to scale). In one embodiment, the length of the conductors 46 and 47 joining the contacts 37 and 38 to the resistors 42 and 43, respectively, is 0.0138 inches. Similarly, the conductor 49 is 0.050×0.040 inches. This embodiment provides approximately 10 dB of attenuation at the desired frequency of use.

As may be seen, the arrangement offers the advantage of allowing different shapes of attenuators and different values of attenuation to be provided simply by changing the pattern of the attenuator circuit arranged on the substrate 40. Thus different attenuation patterns may be realized by a simple change from one relay to another. A number of other values of attenuation which are realized by varying the resistive values and configuration offered by the resistors 42–44 are shown in FIG. 6a.

Figure 4A:
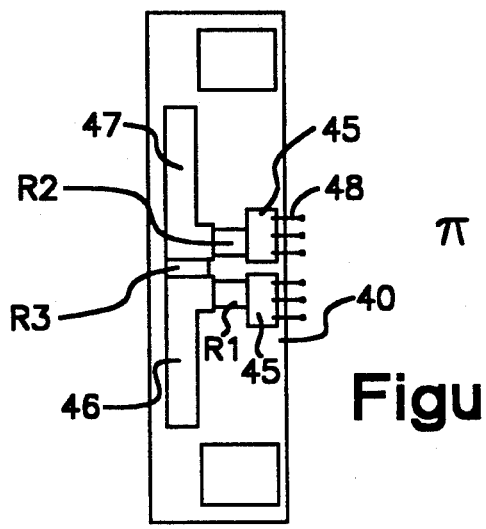
FIG. 4(a-c) are a top view of a portion of the attenuator relay illustrated in FIGS. 1-3 and two attenuator circuits which may be interchanged for a portion of that relay.
Figure 4B:
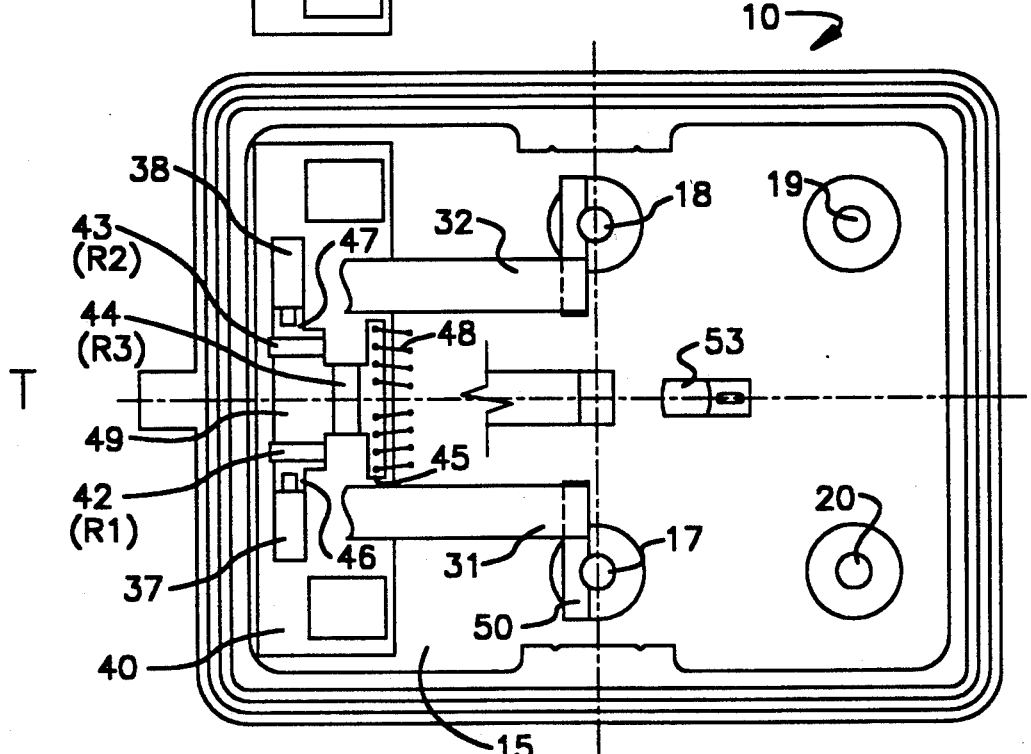
Figure 4C:
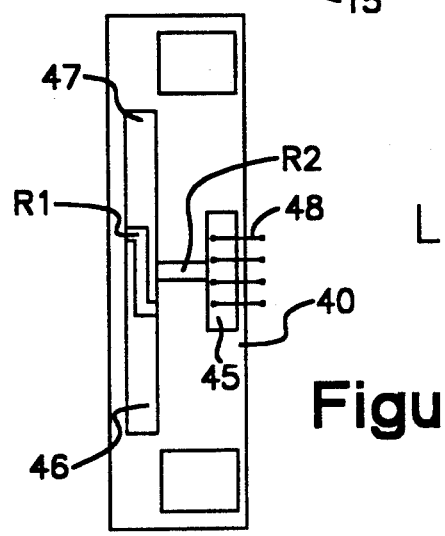

FIGS. 6(a–d) illustrate a table and three different schematic configurations of attenuation networks which may be placed between the contacts 37 and 38 in FIG. 4 to provide different degrees of attenuation. The physical shape of each of the attenuator networks is illustrated in FIGS. 4(a–c). For example, the T network illustrated in FIG. 4(b) and represented schematically in FIG. 6(b) may provide the three different attenuation values shown in FIG. 6(a) by varying the values of the resistors shown as R1, R2, and R3. Similarly, three different attenuations are provided when a pi network such as that shown in FIG. 4(a) and represented schematically in FIG. 6(d) is utilized with different values of resistors. FIG. 6(a) also illustrates a single set of values to provide a degree of attenuation for an L network as is shown in FIGS. 4(c) and 6(c).

In addition to allowing interchangeable attenuator networks, the attenuator network including the resistors 42–44 provides significant advantages over such networks used in the past. For example, it has previously been impossible to contain the large attenuator networks of the prior art within the chassis provided for a receiver without enlarging the chassis significantly. The small size allows the attenuator circuitry of the present invention to be encapsulated within the same enclosure as the relay thereby eliminating any increase in chassis size. More importantly, the length of the conductors used in the smallest attenuator circuits of the prior art are such that such attenuators cannot be used effectively in circuits at frequencies above 1.5 gigahertz. The inductance of the wiring of the prior art circuits is just too great for use with such high frequencies. The present invention which allows the attenuator circuitry to be encapsulated within the same enclosure as the relay significantly reduces the length of the conductors of the attenuator network. This reduction in length significantly reduces the inductance relative to the prior art circuitry (depending on the frequency of use) thereby allowing the use of the attenuator relay in circuits handling much higher frequencies.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An attenuator relay comprising a standard enclosure for encapsulating a miniature electro-mechanical relay and circuitry; a miniature electro-mechanical relay having a number of contacts, the relay providing means for closing a first circuit to allow current flow therethrough in a first condition; and means for closing a second circuit to allow current flow therethrough in a second condition; and an attenuator circuit connected in the first circuit and enclosed within the enclosure.

2. An attenuator relay as claimed in claim 1 in which the attenuator circuit is placed on a substrate within the enclosure.

3. An attenuator relay as claimed in claim 2 in which attenuation provided by the attenuator circuit is adapted to be varied by varying shape and dimensions of the attenuator circuit which is placed on a substrate.

4. An attenuator relay as claimed in claim 2 in which the attenuator circuit is a T network comprising three resistors, and conductors connecting such resistors.

5. An attenuator relay as claimed in claim 4 in which the conductors connecting such resistors are of a length such that the attenuator relay may be used at frequencies of 1.5 gigahertz and above.

6. An attenuator relay as claimed in claim 2 in which the attenuator circuit is a pi network comprising three resistors, and conductors connecting such resistors.

7. An attenuator relay as claimed in claim 2 in which the attenuator circuit is a L network comprising two resistors, and conductors connecting such resistors.

8. An attenuator relay as claimed in claim 2 in which the attenuator circuit placed on a substrate within the enclosure includes resistive material deposited on the substrate to provide resistors of selected values, and conductors provided on the surface of the substrate connecting the resistors in patterns designed to provide selected values of attenuation.

9. A electro-mechanical relay circuit for providing an attenuated input signal to a first circuit or an input signal without attenuation to a second circuit, the relay circuit comprising:
an encapsulating container for a miniature relay;
a miniature electro-mechanical relay positioned within the container and having first and second contacts each connected to provide a conductive path to the exterior of the container,
the relay including mans for placing the first and second contacts in first positions in which the first and second contacts are conductively joined to one another and in second positions; and circuit means connected within the container between the second positions of the first and second conductive contacts for attenuating the electrical signals transferred therebetween.

10. An electro-mechanical attenuator relay circuit as claimed in claim 9 in which the circuit means connected within the container comprises a plurality of resistors connected in a pattern between the first and second conductive contacts and ground.

11. An electro-mechanical attenuator relay circuit as claimed in claim 10 in which the resistors are deposited on a non-conductive substrate positioned within the container, and
the resistors are conductively connected by conductors deposited on the non-conductive substrate.

12. An electro-mechanical attenuator relay circuit as claimed in claim 11 in which the resistors are formed of tantalum nitride;
in which the non-conductive substrate is formed of alumina;
and in which the conductors deposited on the non-conductive substrate are formed of gold.

13. An electro-mechanical attenuator relay circuit as claimed in claim 11 in which the resistors have values of approximately 26 ohms, 26 ohms, and 35 ohms, respectively.

* * * * *

UNITED STATES PATENT AND TRADEMARK OFFICE
Certificate

Patent No. 5,315,273

Patented: May 24, 1994

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Eddie L. Blair, John B. Brownwood, Delo K. K. Chun, and Harvey S. Laner.

Signed and Sealed this Twenty-Second Day of September, 1998.

ROBERT J. PASCAL
*Supervisory Patent Examiner*
Group Art Unit 2502